United States Patent
Camacho et al.

(10) Patent No.: US 8,080,867 B2
(45) Date of Patent: Dec. 20, 2011

(54) INTEGRATED CIRCUIT PACKAGING SYSTEM WITH STACKED INTEGRATED CIRCUIT AND METHOD OF MANUFACTURE THEREOF

(75) Inventors: Zigmund Ramirez Camacho, Singapore (SG); Jairus Legaspi Pisigan, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 51 days.

(21) Appl. No.: 12/608,587

(22) Filed: Oct. 29, 2009

(65) Prior Publication Data

US 2011/0101542 A1    May 5, 2011

(51) Int. Cl.
*H01L 23/02* (2006.01)
(52) U.S. Cl. .......................... 257/686; 257/777
(58) Field of Classification Search .................. 257/787, 257/686, 777, 723, 724, 735, 773
See application file for complete search history.

(56) References Cited

U.S. PATENT DOCUMENTS

| 6,075,284 | A  | * | 6/2000 | Choi et al. ................. | 257/676 |
| 6,337,510 | B1 | * | 1/2002 | Chun-Jen et al. ............ | 257/666 |
| 6,730,544 | B1 | * | 5/2004 | Yang .......................... | 438/110 |
| 7,009,297 | B1 |   | 3/2006 | Chiang et al. | |
| 7,190,080 | B1 |   | 3/2007 | Leu et al. | |
| 7,615,859 | B2 | * | 11/2009 | Kim et al. ................... | 257/696 |
| 2007/0052083 | A1 | * | 3/2007 | Kobayashi et al. .......... | 257/686 |
| 2007/0181990 | A1 |   | 8/2007 | Huang et al. | |
| 2008/0029866 | A1 | * | 2/2008 | Kim et al. ................... | 257/686 |
| 2008/0029867 | A1 | * | 2/2008 | Kim et al. ................... | 257/686 |
| 2008/0136004 | A1 | * | 6/2008 | Yang et al. .................. | 257/686 |
| 2008/0136007 | A1 | * | 6/2008 | Kim et al. ................... | 257/686 |
| 2010/0001391 | A1 | * | 1/2010 | Do et al. ...................... | 257/686 |
| 2010/0038768 | A1 | * | 2/2010 | Kim et al. ................... | 257/686 |

OTHER PUBLICATIONS

U.S. Appl. No. 12/235,000, filed Sep. 22, 2008, Camacho et al.

* cited by examiner

*Primary Examiner* — S. V Clark
(74) *Attorney, Agent, or Firm* — Mikio Ishimaru

(57) ABSTRACT

A method of manufacture of an integrated circuit packaging system includes: forming a base lead having an outer protrusion and an inner protrusion with a recess in between; forming a stack lead having an elongated portion; mounting a base integrated circuit over the inner protrusion or under the elongated portion; mounting the stack lead over the base lead and the base integrated circuit; connecting a stack integrated circuit and the stack lead with the stack integrated circuit over the base integrated circuit; and encapsulating at least a portion of both the base integrated circuit and the stack integrated circuit with the base lead and the stack lead exposed.

8 Claims, 11 Drawing Sheets

INTEGRATED CIRCUIT PACKAGING SYSTEM WITH STACKED INTEGRATED CIRCUIT AND METHOD OF MANUFACTURE THEREOF

TECHNICAL FIELD

The present invention relates generally to an integrated circuit packaging system, and more particularly to a system for an integrated circuit packaging system with a stack integrated circuit.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for thermal efficiency, smaller space, and cost reduction.

Thus, a need still remains for an integrated circuit packaging system providing improved reliability, space savings and low cost manufacturing. In view of the ever-increasing need to improve efficiencies and save costs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a base lead having an outer protrusion and an inner protrusion with a recess in between; forming a stack lead having an elongated portion; mounting a base integrated circuit over the inner protrusion or under the elongated portion; mounting the stack lead over the base lead and the base integrated circuit; connecting a stack integrated circuit and the stack lead with the stack integrated circuit over the base integrated circuit; and encapsulating at least a portion of both the base integrated circuit and the stack integrated circuit with the base lead and the stack lead exposed.

The present invention provides an integrated circuit packaging system, including: a base lead having an outer protrusion and an inner protrusion with a recess in between; a base integrated circuit; a stack lead, having an elongated portion, over the base lead and the base integrated circuit, the base integrated circuit over the inner protrusion or under the elongated portion; a stack integrated circuit connected to the stack lead with the stack integrated circuit over the base integrated circuit; and an encapsulation covering at least a portion of both the base integrated circuit and the stack integrated circuit with the base lead and the stack lead exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
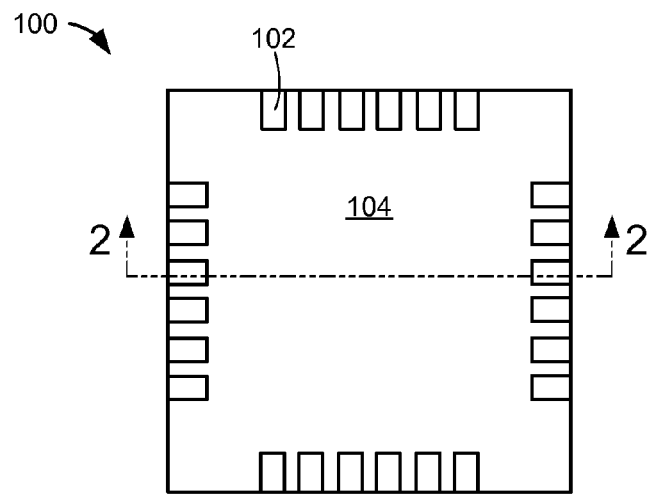
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts the integrated circuit packaging system 100 having a stack lead 102, such as a lead severed from a stack lead frame (not shown). For example, the stack lead frame can be a copper sheet.

For illustrative purposes, the integrated circuit packaging system 100 is shown with one row of the stack lead 102 at a periphery of the integrated circuit packaging system 100, although it is understood that the integrated circuit packaging system 100 can have a different configuration with the stack lead 102. For example, the integrated circuit packaging system 100 can have two or more rows of the stack lead 102 at the periphery of the integrated circuit packaging system 100.

The top view depicts the integrated circuit packaging system 100 having an encapsulation 104, such as a cover including epoxy molding compound. The encapsulation 104 exposes the stack lead 102.

Figure 2:
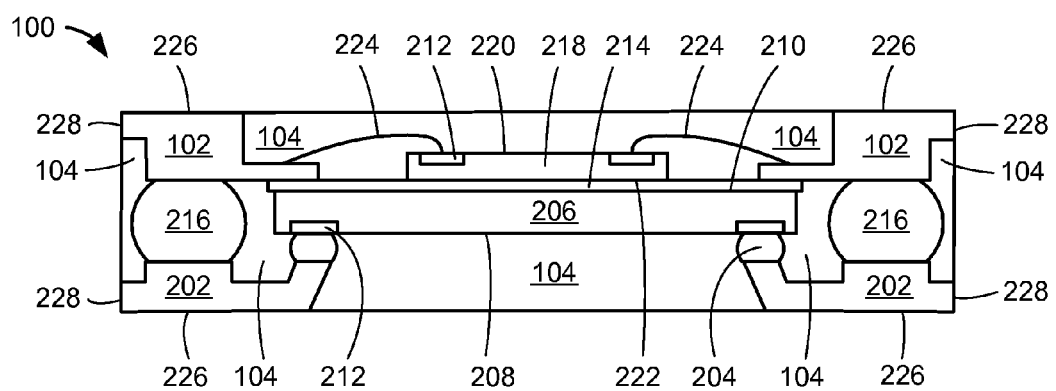
FIG. 2 is a cross-sectional view of the integrated circuit packaging system along a line 2-2 of FIG. 1.

Referring now to FIG. 2, therein is shown a cross-sectional view of the integrated circuit packaging system 100 along a line 2-2 of FIG. 1. The cross-sectional view depicts the integrated circuit packaging system 100 having a base lead 202, such as a lead severed from a base lead frame (not shown). For example, the base lead frame can be a copper sheet.

The integrated circuit packaging system 100 can include any number of the base lead 202. The integrated circuit packaging system 100 can include a chip interconnect 204, such as a solder ball. The chip interconnect 204 can be over the base lead 202.

The integrated circuit packaging system 100 can include a base integrated circuit 206, such as a flip-chip or a wafer level chip scale package (WLCSP), having a base active side 208 and a base non-active side 210. The base active side 208 includes active circuitry thereon. The base active side 208 can include a bond pad 212 which can be covered by the encapsulation 104.

The base integrated circuit 206 can be mounted and electrically connected to the base lead 202 with the base active side 208 facing the base lead 202. The chip interconnect 204 can be attached between the bond pad 212 and the base lead 202.

The integrated circuit packaging system 100 can include an adhesive 214, such as a B-stage adhesive, a die attach material, an acrylic, or epoxy resin, attached to the base non-active side 210.

The integrated circuit packaging system 100 can include a lead interconnect 216, such as a solder ball, between the stack lead 102 and the base lead 202. The stack lead 102 can be attached over the adhesive 214.

The integrated circuit packaging system 100 can include a stack integrated circuit 218, such as a wirebond chip or a flip-chip, having a stack active side 220 and a stack non-active side 222. The stack active side 220 includes active circuitry thereon. The bond pad 212 can be covered by the encapsulation 104.

The stack integrated circuit 218 can be attached over the adhesive 214, with the stack non-active side 222 facing the adhesive 214. The stack lead 102 can be adjacent to the stack integrated circuit 218. The integrated circuit packaging system 100 can include an interconnect 224, such as a bond wire or a solder bump, coupling the stack lead 102 and the bond pad 212.

The stack integrated circuit 218 can be connected to the base integrated circuit 206 by having the stack integrated circuit 218 connected to the stack lead 102 through the interconnect 224, the stack lead 102 mounted over the base lead 202 with the lead interconnect 216 in between, and the base lead 202 connected to the base integrated circuit 206 with the chip interconnect 204 in between.

The integrated circuit packaging system 100 can include the encapsulation 104 on the base lead 202, the base integrated circuit 206, the stack lead 102, and the stack integrated circuit 218. The encapsulation 104 can expose a horizontal exposed surface 226 and a vertical exposed surface 228 of the base lead 202 and the stack lead 102.

The horizontal exposed surface 226 and the vertical exposed surface 228 of the base lead 202 and the stack lead 102 can be co-planar with the encapsulation 104. A top and a bottom of the encapsulation 104 can be flat.

It has been discovered that the present invention provides the integrated circuit packaging system 100 having efficient integration. The efficient integration can be achieved by the stack lead 102 mounted over the base lead 202 and the back-to-back mounting of the base integrated circuit 206 and the stack integrated circuit 218.

Figure 3:
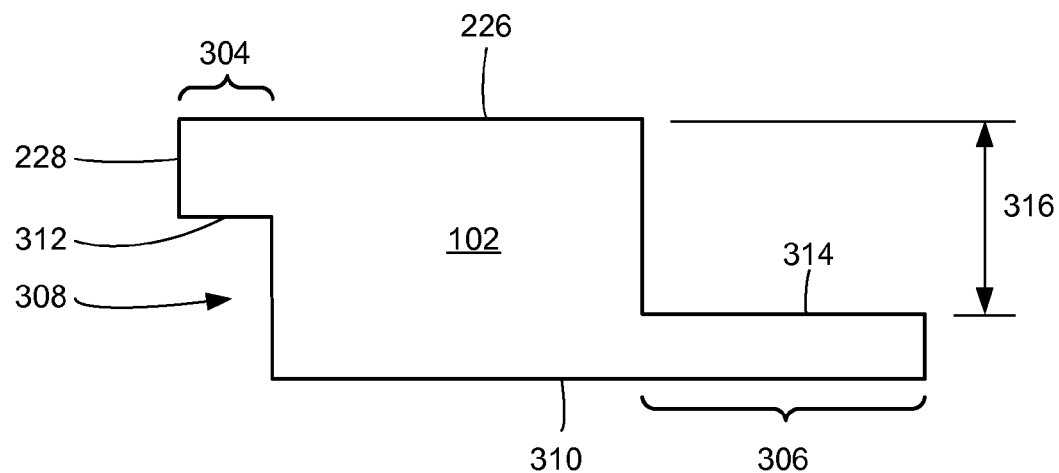
FIG. 3 is a detailed cross-sectional view of the stack lead.

Referring now to FIG. 3, therein is shown a detailed cross-sectional view of the stack lead 102. The stack lead 102 can include an overhang portion 302 and an elongated portion 306.

The overhang portion 302 can be positioned over an undercut 308 of the stack lead 102. A top of the overhang portion 302 can be the horizontal exposed surface 226.

A bottom side 310 of the stack lead 102 can be below a bottom edge 312 of the overhang portion 302. An outer edge of the overhang portion 302 can be the vertical exposed surface 228.

The elongated portion 306 can project inwardly towards the stack integrated circuit 218 of FIG. 2, along the bottom side 310. A bottom of the elongated portion 306 can be the bottom side 310. A top edge 314 of the elongated portion 306 can be below the horizontal exposed surface 226.

The stack integrated circuit 218 of FIG. 2 can be coupled to the stack lead 102 through the interconnect 224 of FIG. 2 connecting the bond pad 212 and the elongated portion 306. The loop height of the interconnect 224 of FIG. 2 can be less than a distance 316 between the horizontal exposed surface 226 and the top edge 314.

Figure 4:
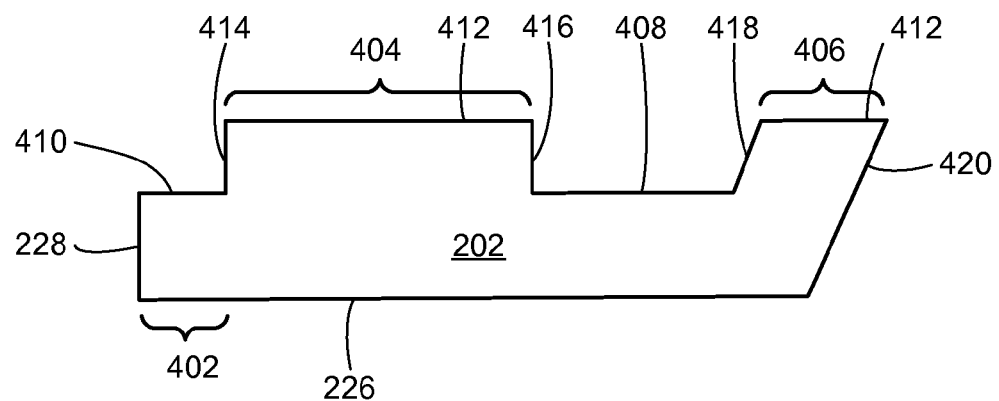
FIG. 4 is a detailed cross-sectional view of the base lead.

Referring now to FIG. 4, therein is shown a detailed cross-sectional view of the base lead 202. The base lead 202 can include a step portion 402, an outer protrusion 404, and an inner protrusion 406, with a recess 408 between the outer protrusion 404 and the inner protrusion 406. The recess 408 can be below a top side 412 of the base lead 202.

A bottom of the step portion 402 can be the horizontal exposed surface 226. An outer edge of the step portion 402 can be the vertical exposed surface 228. A top edge 410 of the step portion 402 can be below the top side 412.

The outer protrusion 404 can be between the step portion 402 and the inner protrusion 406. A top of the outer protrusion 404 can be the top side 412. The outer protrusion 404 can include a first outer protrusion edge 414 and a second outer protrusion edge 416.

The first outer protrusion edge 414 can intersect the top edge 410 and the top side 412. The second edge 416 can intersect the recess 408 and the top side 412. The lead interconnect 216 of FIG. 2 can be attached over the outer protrusion 404.

A top of the inner protrusion 406 can be the top side 412. The inner protrusion 406 can include a first inner protrusion edge 418 and a second inner protrusion edge 420.

The first inner protrusion edge 418 can intersect the recess 408 and the top side 412. The second inner protrusion edge 420 can intersect the horizontal exposed surface 226 and the top side 412. The chip interconnect 204 of FIG. 2 can be attached over the inner protrusion 406.

The angle of the first inner protrusion edge 418 and the angle of the second inner protrusion edge 420 can vary depending on the applications. The outer protrusion 404 and the inner protrusion 406 can provide a mold locking function.

The recess 408 can limit the lead interconnect 216 of FIG. 2 and the chip interconnect 204 of FIG. 2 from flowing down or collapsing when attached on the outer protrusion 404 and the inner protrusion 406, respectively, thereby reducing or eliminating adverse shorting of the lead interconnect 216 and the chip interconnect 204.

Figure 5:
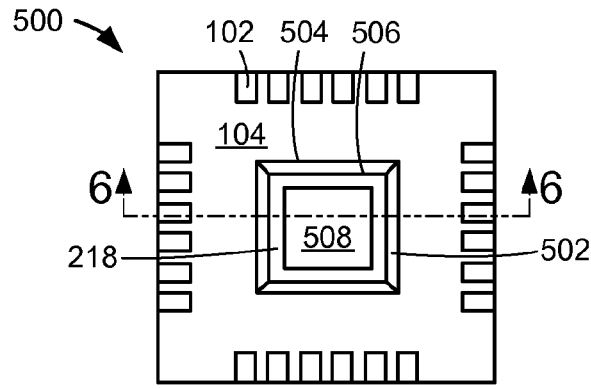
FIG. 5 is a top view of an integrated circuit packaging system in a second embodiment of the present invention.

Referring now to FIG. 5, therein is shown a top view of an integrated circuit packaging system 500 in a second embodiment of the present invention. The top view is shown with the stack lead 102.

For illustrative purposes, the integrated circuit packaging system 500 is shown with one row of the stack lead 102 at a periphery of the integrated circuit packaging system 500, although it is understood that the integrated circuit packaging system 500 can have a different configuration with the stack lead 102. For example, the integrated circuit packaging system 500 can have two or more rows of the stack lead 102 at the periphery of the integrated circuit packaging system 500.

The top view is shown with the top portion of the encapsulation 104. The integrated circuit packaging system 500 can include a second recess wall 502 having a top 504 and a bottom 506.

The integrated circuit packaging system 500 can include a second external component 508, such as an integrated circuit, a resistor pack, a voltage regulator, or an analog filter. The second external component 508 can be mounted on the stack integrated circuit 218.

Figure 6:
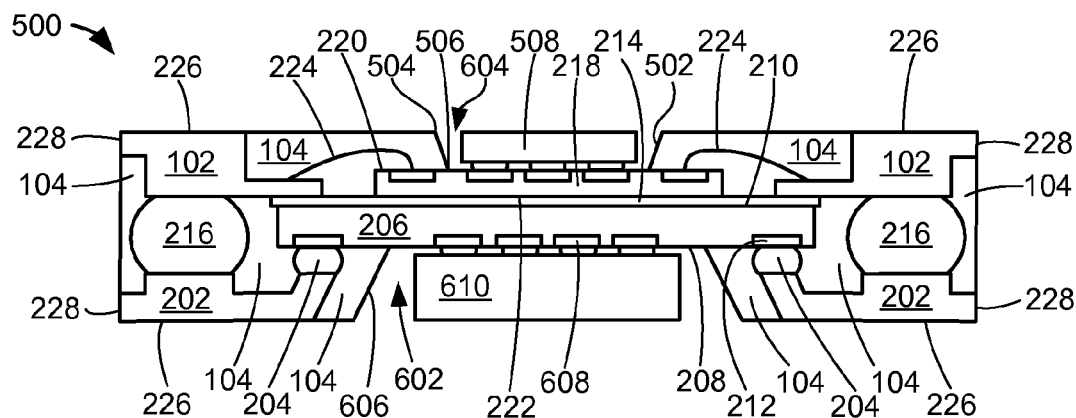
FIG. 6 is a cross-sectional view of the integrated circuit packaging system along a line 6-6 of FIG. 5.

Referring now to FIG. 6, therein is shown a cross-sectional view of the integrated circuit packaging system 500 along a line 6-6 of FIG. 5. The cross-sectional view depicts the base lead 202. The integrated circuit packaging system 500 can include any number of the base lead 202.

The integrated circuit packaging system 500 can include the chip interconnect 204, such as a solder ball, over the base lead 202. The cross-sectional view depicts the base integrated circuit 206, such as a flip-chip or a wafer level chip scale package (WLCSP), having the base active side 208 and the base non-active side 210.

The base active side 208 can contain the bond pad 212 which can be covered by the encapsulation 104. The base integrated circuit 206 can be mounted and electrically connected to the base lead 202. The base active side 208 can be facing the base lead 202 and the chip interconnect 204 attached between the bond pad 212 and the base lead 202.

The base non-active side 210 can be over the base active side 208. The base integrated circuit 206 can have the adhesive 214, such as a backside B-stage adhesive or an acrylic or epoxy resin, applied to the base non-active side 210.

The integrated circuit packaging system 500 can include the stack lead 102 mounted over the base lead 202, with the lead interconnect 216, such as a solder ball, in between. The stack lead 102 can be attached over the adhesive 214.

The integrated circuit packaging system 500 can include the stack integrated circuit 218, such as an integrated circuit die, having the stack active side 220 and the stack non-active side 222. The stack active side 220 can contain the bond pad 212 which can be covered by the encapsulation 104.

The stack integrated circuit 218 can be attached over the adhesive 214, with the stack non-active side 222 over the adhesive 214. The stack active side 220 can be over the stack non-active side 222.

The stack lead 102 can be adjacent to the stack integrated circuit 218. The stack integrated circuit 218 can be coupled to the stack lead 102 through the interconnect 224 connecting the bond pad 212 of the stack integrated circuit 218 and the stack lead 102. The loop height of the interconnect 224 can be less than the distance 316 of FIG. 3 between the horizontal exposed surface 226 of the stack lead 102 and the top edge 314 of FIG. 3 of the elongated portion 306 of FIG. 3 of the stack lead 102.

The stack integrated circuit 218 can be connected to the base integrated circuit 206 by having the stack integrated circuit 218 connected to the stack lead 102 through the interconnect 224, the stack lead 102 mounted over the base lead 202 with the lead interconnect 216 in between, and the base lead 202 connected to the base integrated circuit 206 with the chip interconnect 204 in between.

The integrated circuit packaging system 500 can include the encapsulation 104 on the base lead 202, the base integrated circuit 206, the stack lead 102, and the stack integrated circuit 218. The encapsulation 104 can expose the horizontal exposed surface 226 and the vertical exposed surface 228 of the base lead 202 and the stack lead 102. The horizontal exposed surface 226 and the vertical exposed surface 228 of the base lead 202 and the stack lead 102 can be co-planar with the encapsulation 104.

The integrated circuit packaging system 500 can include the encapsulation 104 having a first recess 602 and a second recess 604 in the bottom and the top of the encapsulation 104, respectively.

The cross-sectional view depicts a first recess wall 606 of the first recess 602. The encapsulation 104 can expose the base active side 208 in the first recess 602.

The cross-sectional view depicts the second recess wall 502 of the second recess 604 having the top 504 and the bottom 506. The encapsulation 104 can expose the stack active side 220 in the second recess 604.

The base integrated circuit 206 and the stack integrated circuit 218 can include an interior pad 608, such as a bond pad. The encapsulation 104 can expose the interior pad 608.

The integrated circuit packaging system 500 can include a first external component 610 on the interior pad 608 of the base integrated circuit 206. The integrated circuit packaging system 500 can include the second external component 508 on the interior pad 608 of the stack integrated circuit 218.

It has been discovered that the present invention provides the integrated circuit packaging system 500 having thermal efficiency. The integrated circuit packaging system 500 provides thermal convection of the heat from the base integrated circuit 206 and the stack integrated circuit 218 by exposing the base active side 208 and the stack active side 220, respectively.

It has also been discovered that the present invention provides the integrated circuit packaging system 500 having further connection. The integrated circuit packaging system 500 provides further connection to the first external component 610 in the first recess 602 and the second external component 508 in the second recess 604.

Figure 7:
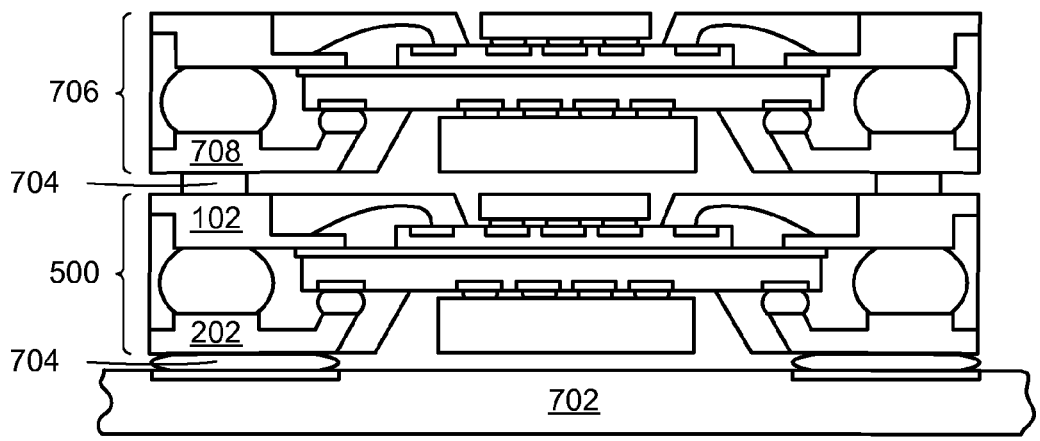
FIG. 7 is a cross-sectional view of the integrated circuit packaging system of FIG. 6 in an application example.

Referring now to FIG. 7, therein is shown a cross-sectional view of the integrated circuit packaging system 500 of FIG. 6 in an application example. The cross-sectional view depicts the integrated circuit packaging system 500 mounted over a substrate 702, such as printed circuit board (PCB) or flex circuit, with a system interconnect 704, such as solder paste, conductive epoxy, gold, silver, tin-lead solder, conductive alloys, or any combination thereof, in between.

The cross-sectional view is shown with the integrated circuit packaging system 500, as examples, although it is understood that the cross-sectional view can include the integrated circuit packaging system 100 of FIG. 2.

An additional integrated circuit packaging system 706 can be stacked over the integrated circuit packaging system 500 with the system interconnect 704 in between. The additional integrated circuit packaging system 706 can be identical to the integrated circuit packaging system 500.

The additional integrated circuit packaging system 706 can include a further base lead 708, which can be identical to the base lead 202. The further base lead 708 can be stacked over the stack lead 102, with the system interconnect 704 in between.

The cross-sectional view is shown with the additional integrated circuit packaging system 706 identical to the integrated circuit packaging system 500, as examples, although it is understood that the additional integrated circuit packaging system 706 can be identical to the integrated circuit packaging system 100 of FIG. 2.

The cross-sectional view is shown with the integrated circuit packaging system 500 and the additional integrated circuit packaging system 706, as examples, although it is understood that the cross-sectional view can include of any number of the integrated circuit packaging system 500 and the additional integrated circuit packaging system 706.

It has been discovered that the present invention provides the integrated circuit packaging system 500 including an efficient method of forming a thermal conductive path to the substrate 702. A large amount of heat is transferred from the base integrated circuit 206 of FIG. 6 and the stack integrated circuit 218 of FIG. 6 through the stack lead 102 of FIG. 6, the lead interconnect 216 of FIG. 6, and the base lead 202 of FIG. 6, to the substrate 702. The reliability and the life of the base integrated circuit 206 of FIG. 6 and the stack integrated circuit 218 of FIG. 6 are increased.

Figure 8A:
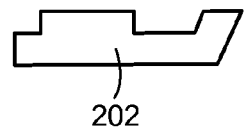
FIGS. 8(A)-8(G) are cross-sectional views of the integrated circuit packaging system of FIG. 1 in a first assembly process.
Figure 8A:

Referring now to FIGS. 8(A)-8(G), therein are shown a cross-sectional view of the integrated circuit packaging system 100 of FIG. 1 in a first assembly process. In FIG. 8(A), the first assembly process depicts a forming phase of the base lead 202.

The base lead 202 can be severed from the base lead frame (not shown), such as a copper sheet, that is stamped, etched, cut, or a combination thereof. The base lead 202 can be plated with gold, nickel, palladium, copper, tin, or any combination thereof or other metal alloys.

Figure 8B:
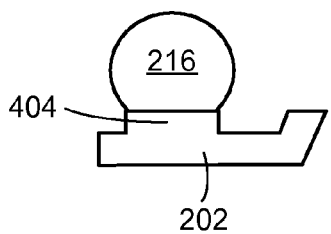
Figure 8B:
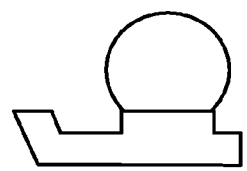

Referring now to FIG. 8(B), therein is shown a cross-sectional view of the structure of FIG. 8(A) in an attaching phase of the lead interconnect 216. The lead interconnect 216 can be attached over the outer protrusion 404 of the base lead 202.

Figure 8C:
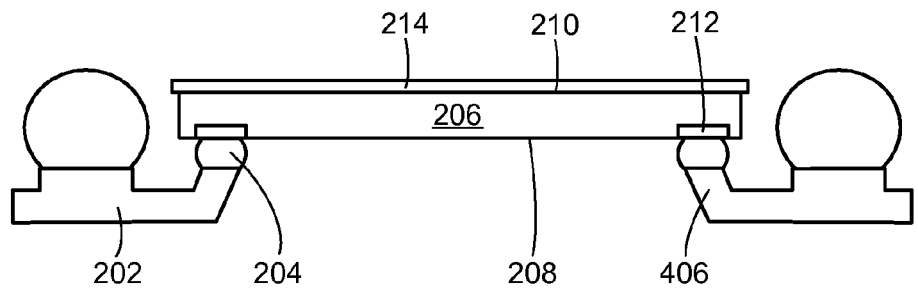

Referring now to FIG. 8(C), therein is shown a cross-sectional view of the structure of FIG. 8(B) in a mounting phase of the base integrated circuit 206. The chip interconnect 204 can be attached over the inner protrusion 406 of the base lead 202.

The base integrated circuit 206 can be mounted over the chip interconnect 204 by positioning the bond pad 212 over the chip interconnect 204. The adhesive 214 can be applied to the base non-active side 210 and the base active side 208 facing the chip interconnect 204.

Figure 8D:
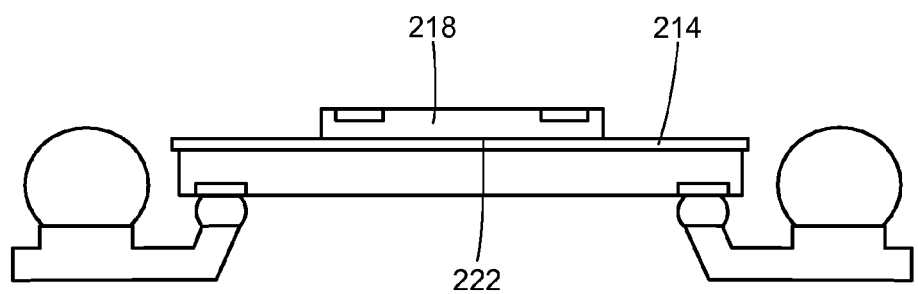

Referring now to FIG. 8(D), therein is shown a cross-sectional view of the structure of FIG. 8(C) in a mounting phase of the stack integrated circuit 218. The stack non-active side 222 can be mounted over the adhesive 214. The stack non-active side 222 can be facing the adhesive 214.

Figure 8E:
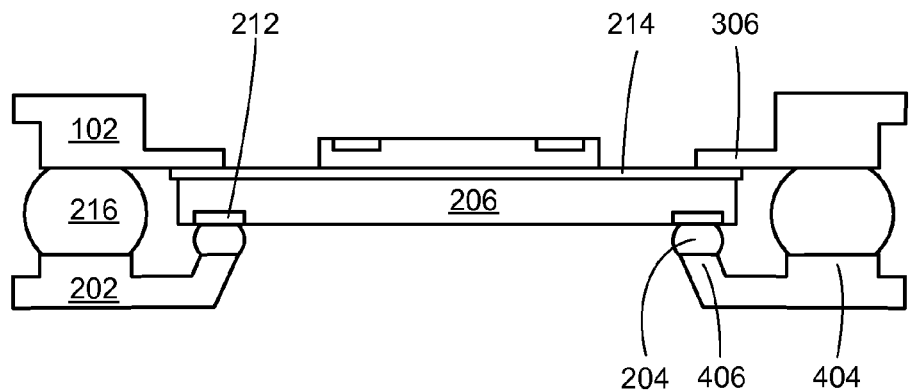

Referring now to FIG. 8(E), therein is shown a cross-sectional view of the structure of FIG. 8(D) in a mounting phase of the stack lead 102.

The stack lead 102 can be severed from the stack lead frame (not shown), such as a copper sheet, that is stamped, etched, cut, or a combination thereof. The stack lead 102 can be plated with gold, nickel, palladium, copper, tin, or any combination thereof or other metal alloys.

The stack lead 102 can be mounted over the lead interconnect 216. The elongated portion 306 of the stack lead 102 can be mounted over the adhesive 214.

The first assembly process can include a reflowing process to form a joint, such as a metallurgical joint, between the lead interconnect 216 and both of the outer protrusion 404 of the base lead 202 and the stack lead 102. The reflowing process can also form the joint between the chip interconnect 204 and both of the inner protrusion 406 of the base lead 202 and the bond pad 212 of the base integrated circuit 206.

Figure 8F:
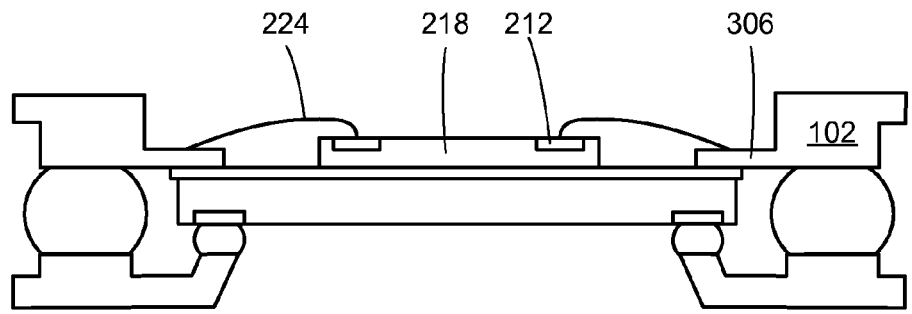

Referring now to FIG. 8(F), therein is shown a cross-sectional view of the structure of FIG. 8(E) in a coupling phase of the stack integrated circuit 218. The first assembly process can include the interconnect 224 coupling the elongated portion 306 of the stack lead 102 and the bond pad 212 of the stack integrated circuit 218.

Figure 8G:
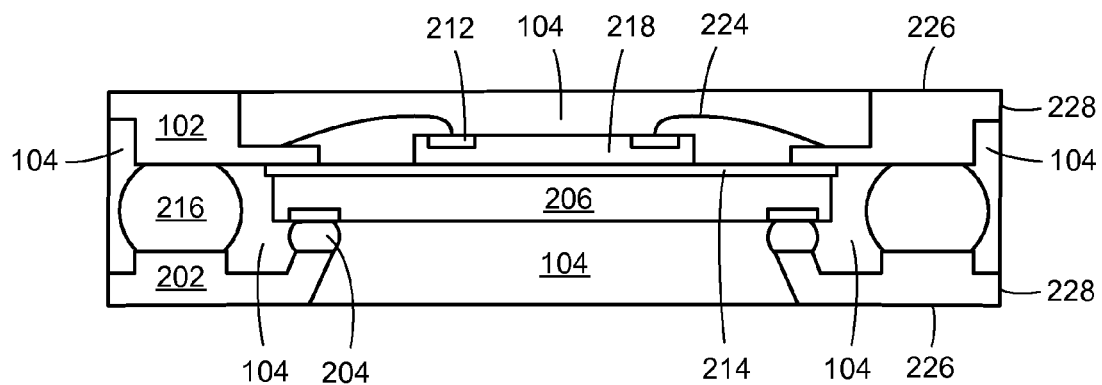

Referring now to FIG. 8(G), therein is shown a cross-sectional view of the structure of FIG. 8(F) in a forming phase of the encapsulation 104. The first assembly process can form the encapsulation 104 covering the base lead 202, the lead interconnect 216, the chip interconnect 204, the base integrated circuit 206, the adhesive 214, the stack lead 102, the stack integrated circuit 218, the base integrated circuit 206, and the interconnect 224.

The encapsulation 104 can expose the horizontal exposed surface 226 and the vertical exposed surface 228. The horizontal exposed surface 226 and the vertical exposed surface 228 can be co-planar with the encapsulation 104. The first assembly process can include a singulation process to individually produce the integrated circuit packaging system 100.

Figure 9A:
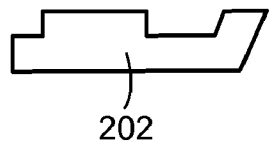
FIGS. 9(A)-9(G) are cross-sectional views of the integrated circuit packaging system of FIG. 1 in a second assembly process.
Figure 9A:

Referring now to FIGS. 9(A)-9(G), therein are shown a cross-sectional view of the integrated circuit packaging system 100 of FIG. 1 in a second assembly process. In FIG. 9(A), the second assembly process depicts a forming phase of the base lead 202.

The base lead 202 can be severed from the base lead frame (not shown), such as a copper sheet, that is stamped, etched, cut, or a combination thereof. The base lead 202 can be plated with gold, nickel, palladium, copper, tin, or any combination thereof or other metal alloys.

Figure 9B:
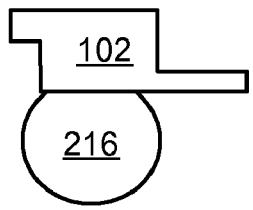
Figure 9B:
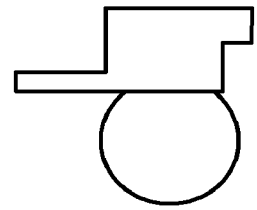

Referring now to FIG. 9(B), therein is shown a cross-sectional view in the second assembly process in an attaching phase of the lead interconnect 216.

The stack lead 102 can be severed from the stack lead frame (not shown), such as a copper sheet, that is stamped, etched, cut, or a combination thereof. The stack lead 102 can be plated with gold, nickel, palladium, copper, tin, or any combination thereof or other metal alloys.

The lead interconnect 216 can be attached to the stack lead 102 with the stack lead 102 over the lead interconnect 216.

Figure 9C:
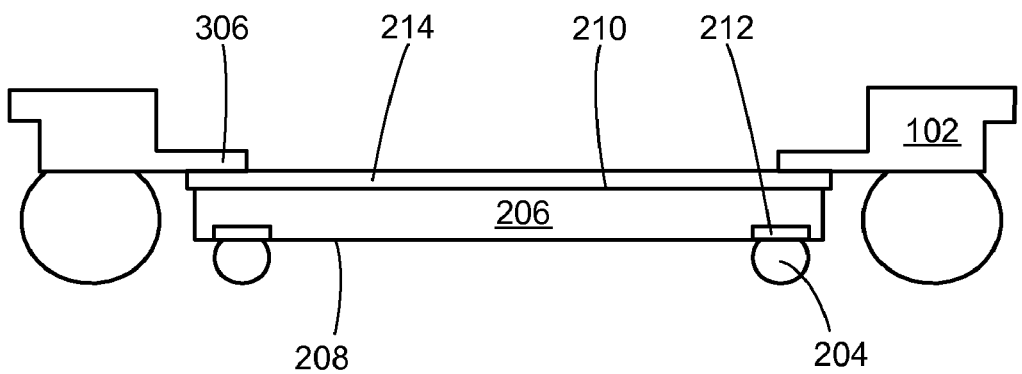

Referring now to FIG. 9(C), therein is shown a cross-sectional view of the structure of FIG. 9(B) in an attaching phase of the base integrated circuit 206. The chip interconnect 204 can be attached to the bond pad 212 at the base active side 208 with the base active side 208 over the chip interconnect 204.

The adhesive 214 can be attached to the base non-active side 210. The second assembly process can form a chip-on-lead (COL) structure by adhering the base integrated circuit 206 to the elongated portion 306 of the stack lead 102, with the adhesive 214 in between.

Figure 9D:
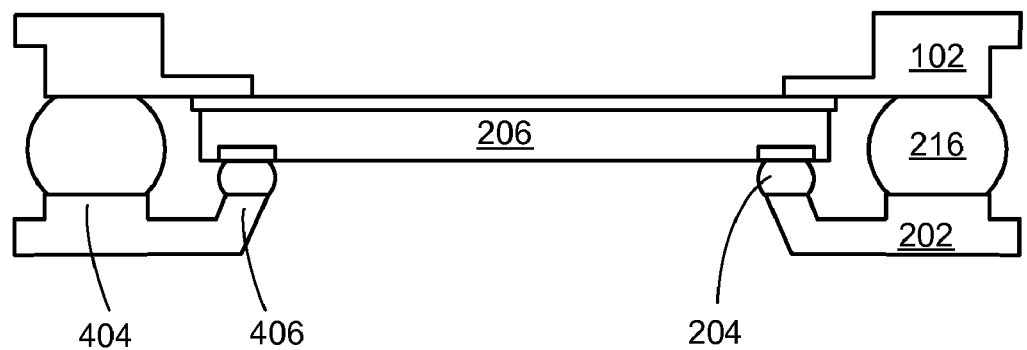

Referring now to FIG. 9(D), therein is shown a cross-sectional view of the structure of FIG. 9(C) in a stacking phase of the stack lead 102. The stack lead 102 can be mounted over the outer protrusion 404 of the base lead 202 with the lead interconnect 216 in between. The base integrated circuit 206 can be mounted over the inner protrusion 406 of the base lead 202 with the chip interconnect 204 in between.

The second assembly process can include a reflowing process to form a joint, such as a metallurgical joint, between the lead interconnect 216 and both of the outer protrusion 404 of the base lead 202 and the stack lead 102, and between the chip interconnect 204 and both of the inner protrusion 406 of the base lead 202 and the bond pad 212 of the base integrated circuit 206.

Figure 9E:
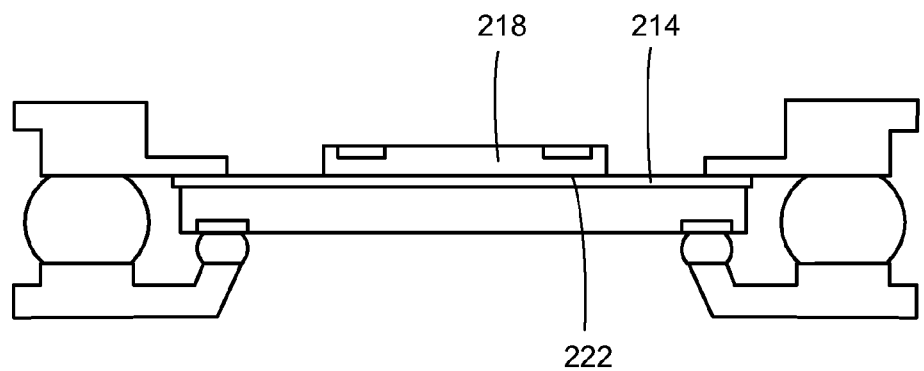

Referring now to FIG. 9(E), therein is shown a cross-sectional view of the structure of FIG. 9(D) in a mounting phase of the stack integrated circuit 218. The stack non-active side 222 can be mounted over the adhesive 214.

Figure 9F:
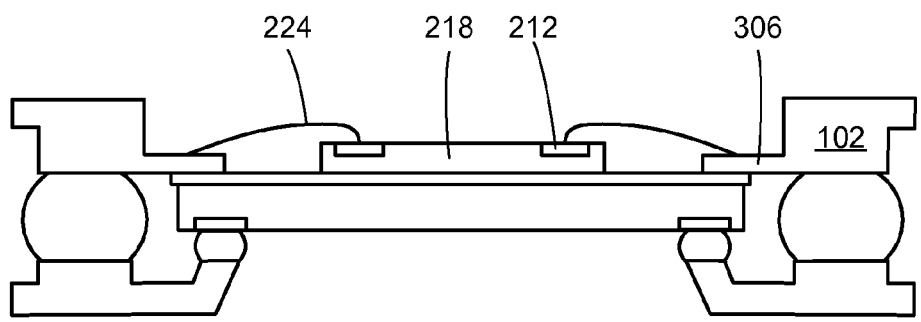

Referring now to FIG. 9(F), therein is shown a cross-sectional view of the structure of FIG. 9(E) in a coupling phase of the stack integrated circuit 218. The second assembly process can include the interconnect 224 coupling the elongated portion 306 of the stack lead 102 and the bond pad 212 of the stack integrated circuit 218.

Figure 9G:
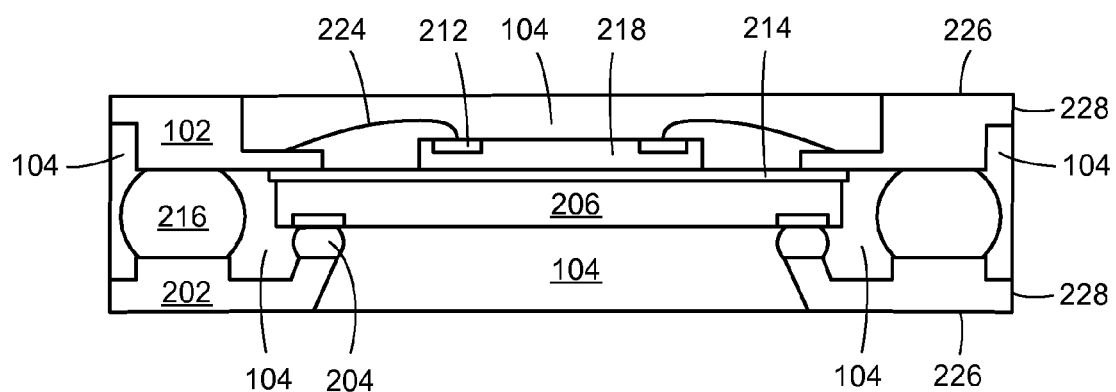

Referring now to FIG. 9(G), therein is shown a cross-sectional view of the structure of FIG. 9(F) in a forming phase of the encapsulation 104. The second assembly process can form the encapsulation 104 on the base lead 202, the lead interconnect 216, the chip interconnect 204, the base integrated circuit 206, the adhesive 214, the stack lead 102, the stack integrated circuit 218, the bond pad 212 of both of the base integrated circuit 206 and the stack integrated circuit 218, and the interconnect 224.

The second assembly process can include a singulation process to individually produce the integrated circuit packaging system 100. The encapsulation 104 can expose the horizontal exposed surface 226 and the vertical exposed surface 228 of the base lead 202 and the stack lead 102. The horizontal exposed surface 226 and the vertical exposed surface 228 of both of the base lead 202 and the stack lead 102 can be co-planar with the encapsulation 104.

Figure 10A:
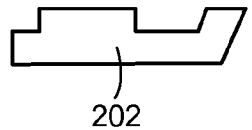
FIGS. 10(A)-10(I) are cross-sectional views of the integrated circuit packaging system of FIG. 5 in an assembly process.
Figure 10A:

Referring now to FIGS. 10(A)-10(I), therein are shown a cross-sectional view of the integrated circuit packaging system 500 of FIG. 5 in an assembly process. In FIG. 10(A), the second assembly process depicts a forming phase of the base lead 202.

The base lead 202 can be severed from the base lead frame (not shown), such as a copper sheet, that is stamped, etched, cut, or a combination thereof. The base lead 202 can be plated with gold, nickel, palladium, copper, tin, or any combination thereof or other metal alloys.

Figure 10B:
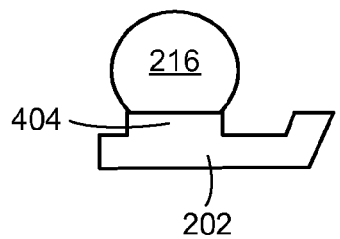
Figure 10B:
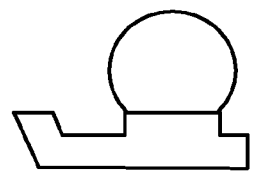

Referring now to FIG. 10(B), therein is shown a cross-sectional view of the structure of FIG. 10(A) in an attaching phase of the lead interconnect 216. The lead interconnect 216 can be attached over the outer protrusion 404 of the base lead 202.

Figure 10C:
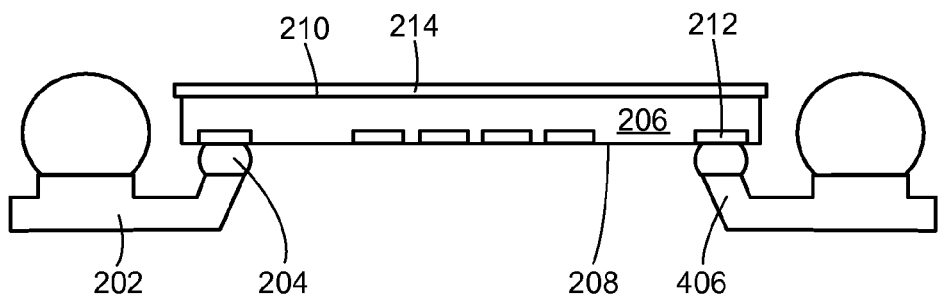

Referring now to FIG. 10(C), therein is shown a cross-sectional view of the structure of FIG. 10(B) in a mounting phase of the base integrated circuit 206. The chip interconnect 204 can be attached over the inner protrusion 406 of the base lead 202.

The base integrated circuit 206 can be mounted over the chip interconnect 204 by positioning the bond pad 212 at the base active side 208 over the chip interconnect 204. The adhesive 214 can be attached to the base non-active side 210.

Figure 10D:
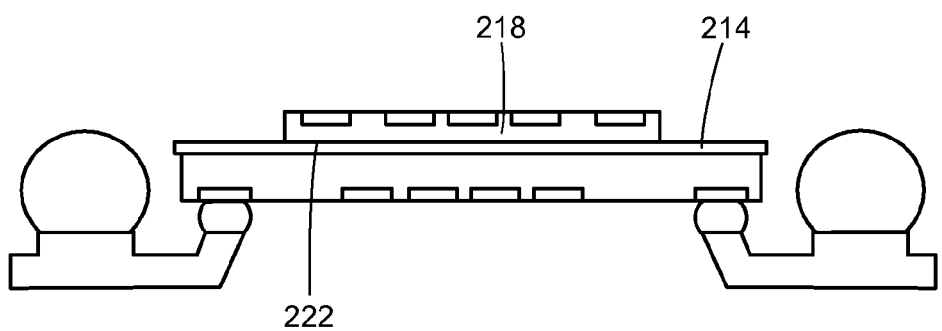

Referring now to FIG. 10(D), therein is shown a cross-sectional view of the structure of FIG. 10(C) in a mounting phase of the stack integrated circuit 218. The stack non-active side 222 can be mounted over the adhesive 214.

Figure 10E:
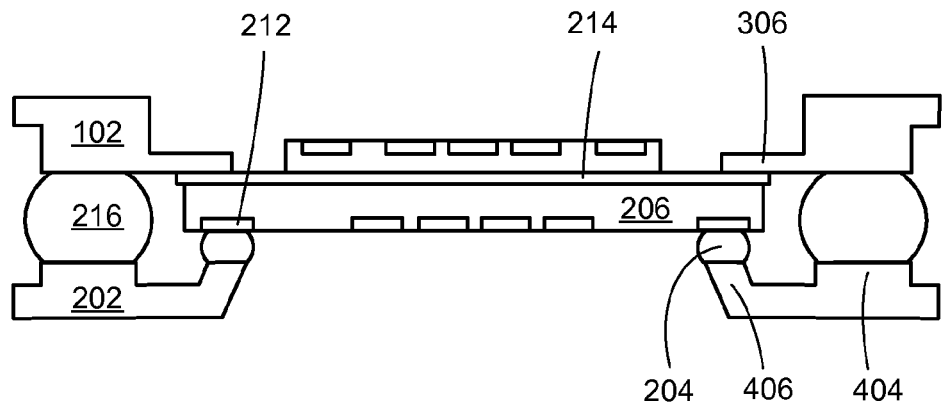

Referring now to FIG. 10(E), therein is shown a cross-sectional view of the structure of FIG. 10(D) in a mounting phase of the stack lead 102.

The stack lead 102 can be severed from the stack lead frame (not shown), such as a copper sheet, that is stamped, etched, cut, or a combination thereof. The stack lead 102 can be plated with gold, nickel, palladium, copper, tin, or any combination thereof or other metal alloys.

The stack lead 102 can be mounted over the lead interconnect 216. The elongated portion 306 of the stack lead 102 can mount over the adhesive 214.

The assembly process can include a reflowing process to form a joint, such as a metallurgical joint, between the lead interconnect 216 and both of the outer protrusion 404 of the base lead 202 and the stack lead 102, and between the chip interconnect 204 and both of the inner protrusion 406 of the base lead 202 and the bond pad 212 of the base integrated circuit 206.

Figure 10F:
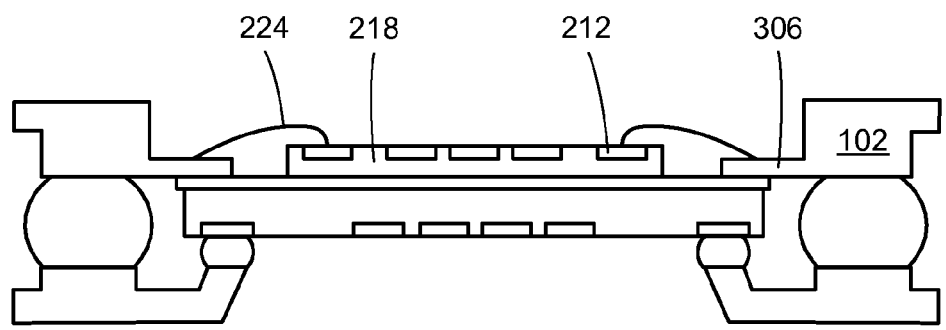

Referring now to FIG. 10(F), therein is shown a cross-sectional view of the structure of FIG. 10(E) in a coupling phase of the stack integrated circuit 218. The assembly process can include the interconnect 224 coupling the elongated portion 306 of the stack lead 102 and the bond pad 212 of the stack integrated circuit 218.

Figure 10G:
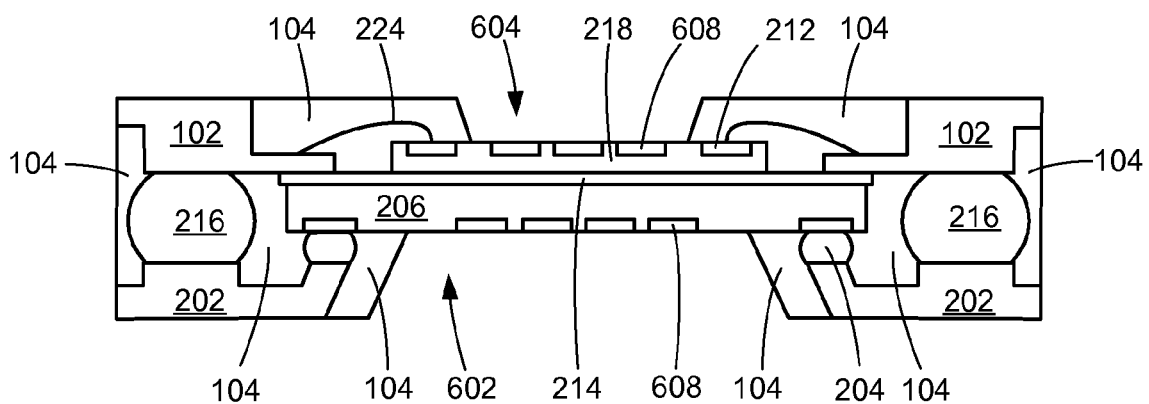

Referring now to FIG. 10(G), therein is shown a cross-sectional view of the structure of FIG. 10(F) in a forming phase of the encapsulation 104. The assembly process can form the encapsulation 104, preferably using film assist recess molding, on the base lead 202, the lead interconnect 216, the chip interconnect 204, the base integrated circuit 206, the adhesive 214, the stack lead 102, the stack integrated circuit 218, the bond pad 212 of both of the base integrated circuit 206 and the stack integrated circuit 218, and the interconnect 224.

The integrated circuit packaging system 500 can include the encapsulation 104 having the first recess 602 or the second recess 604 in the bottom or the top of the encapsulation 104, respectively. The encapsulation 104 can expose the interior pad 608 of the base integrated circuit 206 and the stack integrated circuit 218.

Figure 10H:
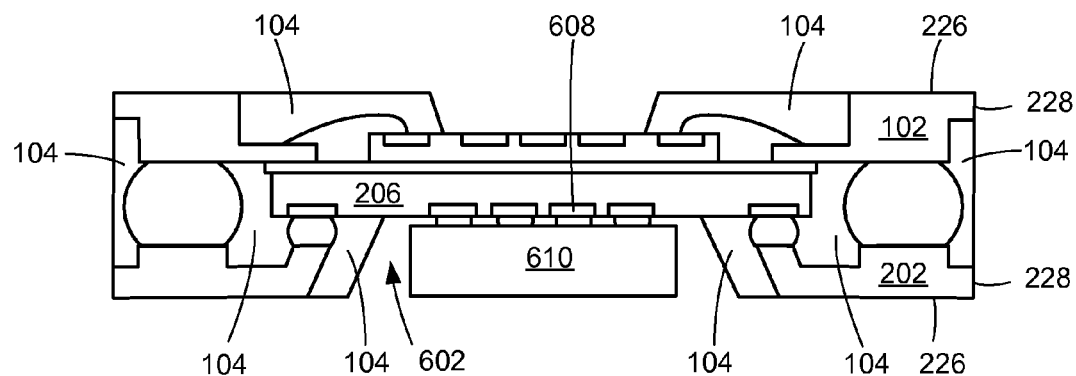

Referring now to FIG. 10(H), therein is shown a cross-sectional view of the structure of FIG. 10(G) in an integration phase of the first external component 610. The assembly process can mount the first external component 610 on the interior pad 608 of the base integrated circuit 206 in the first recess 602.

The assembly process can include a singulation process to individually produce the integrated circuit packaging system 500. The encapsulation 104 can expose the horizontal exposed surface 226 and the vertical exposed surface 228 of the base lead 202 and the stack lead 102. The horizontal exposed surface 226 and the vertical exposed surface 228 of both of the base lead 202 and the stack lead 102 can be co-planar with the encapsulation 104.

Figure 10I:
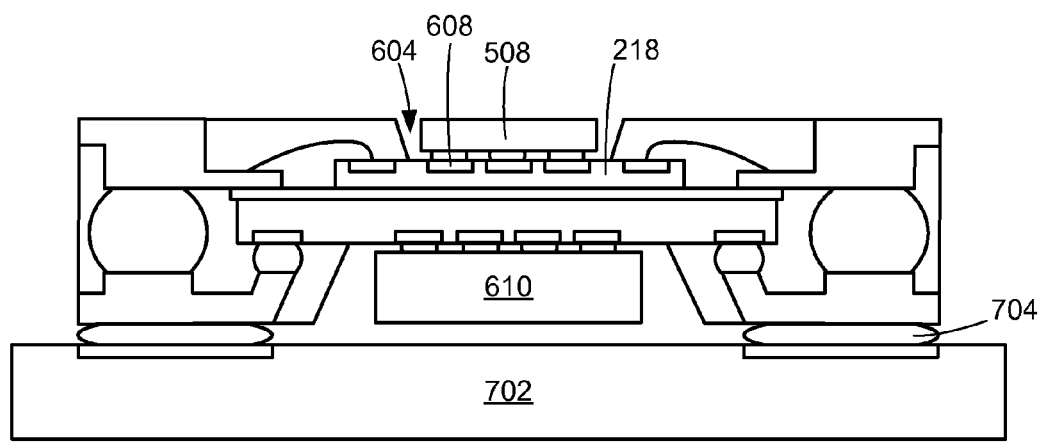

Referring now to FIG. 10(I), therein is shown a cross-sectional view of the structure of FIG. 10(H) in an integration phase of the second external component 508. After the singulation process, the assembly process can mount the second external component 508 on the interior pad 608 of the stack integrated circuit 218 in the second recess 604.

The integrated circuit packaging system 500, integrated with the first external component 610, the second external component 508, or any combination thereof, can be mounted over the substrate 702. The system interconnect 704 can be attached between the integrated circuit packaging system 500 and the substrate 702.

Figure 11:
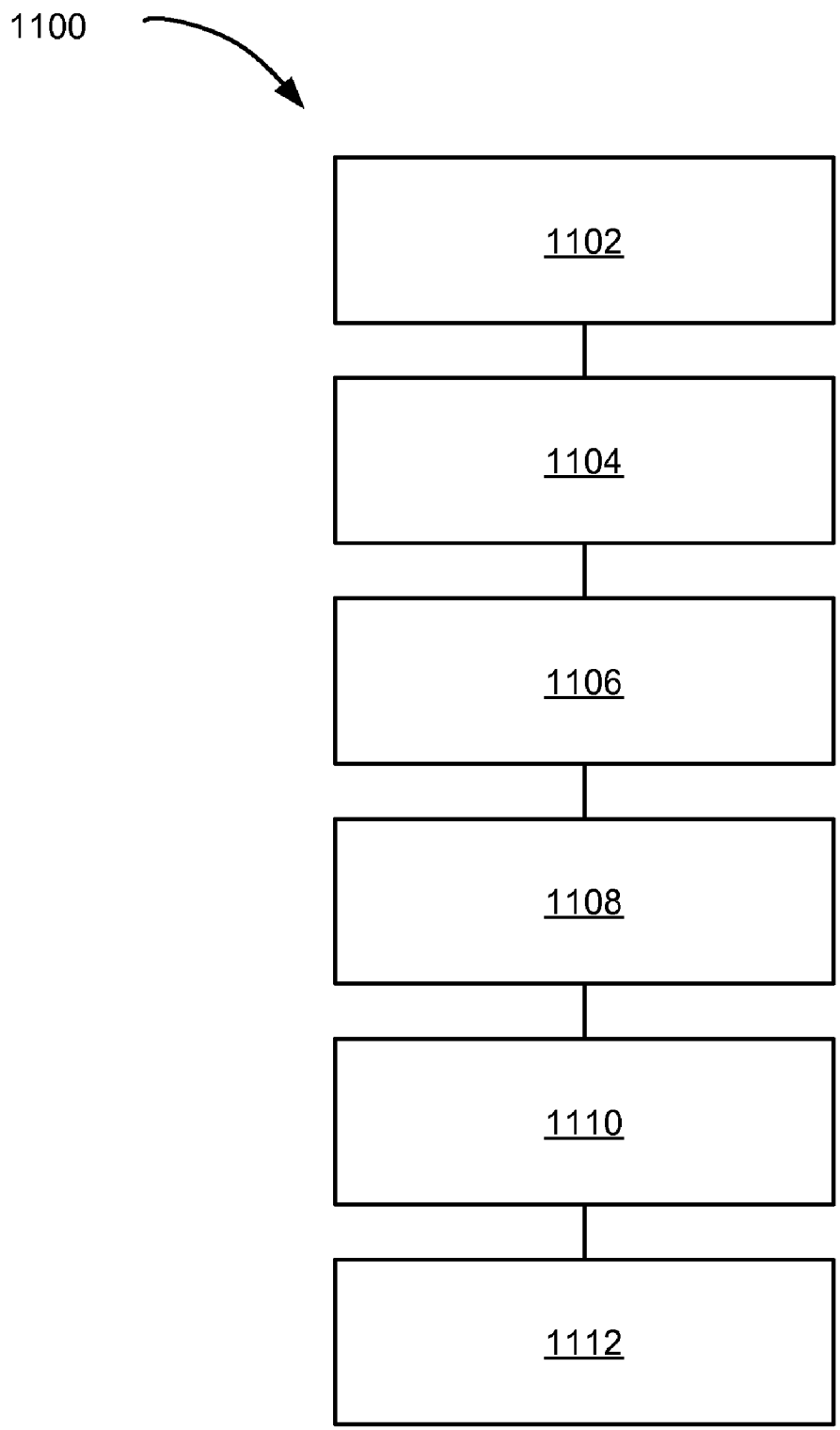
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: forming a base lead having an outer protrusion and an inner protrusion with a recess in between in a block 1102; forming a stack lead having an elongated portion in a block 1104; mounting a base integrated circuit over the inner protrusion or under the elongated portion in a block 1106; mounting the stack lead over the base lead and the base integrated circuit in a block 1108; connecting a stack integrated circuit and the stack lead with the stack integrated circuit over the base integrated circuit in a block 1110; and encapsulating at least a portion of both the base integrated circuit and the stack integrated circuit with the base lead and the stack lead exposed in a block 1112.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a base lead having an outer protrusion and an inner protrusion with a recess in between;
   a flip-chip, having a base non-active side, coupled to and facing the inner protrusion;
   a stack lead, having an overhang portion and an elongated portion, over the outer protrusion and the base non-active side with the flip-chip over the inner protrusion or under the elongated portion;
   a stack integrated circuit connected to the elongated portion with the stack integrated circuit over the flip-chip; and
   an encapsulation covering at least a portion of both the flip-chip and the stack integrated circuit with the base lead and the overhang portion exposed.

2. The system as claimed in claim 1 wherein the stack lead over the base lead and the flip-chip includes:
   the stack lead connected to the outer protrusion; and
   the elongated portion over a base non-active side of the flip-chip.

3. The system as claimed in claim 1 wherein the stack integrated circuit connected to the stack lead includes the stack integrated circuit connected to the elongated portion.

4. The system as claimed in claim 1 wherein the flip-chip over the inner protrusion includes the flip-chip connected to the inner protrusion with the flip-chip facing the inner protrusion.

5. The system as claimed in claim 1 wherein the stack integrated circuit connected to the stack lead with the stack integrated circuit over the flip-chip includes the stack integrated circuit connected to the flip-chip.

6. The system as claimed in claim 1 wherein the encapsulation includes:
   the encapsulation having a recess exposing the flip-chip, the stack integrated circuit, or a combination thereof; and
further comprising:
   an external component in the recess.

7. The system as claimed in claim 1 further comprising a further base lead over the stack lead, the further base lead identical to the base lead.

8. The system as claimed in claim 1 further comprising a lead interconnect between the base lead and the stack lead.

* * * * *